(12) United States Patent
Nair et al.

(10) Patent No.: US 7,863,112 B2
(45) Date of Patent: Jan. 4, 2011

(54) METHOD AND STRUCTURE TO PROTECT FETS FROM PLASMA DAMAGE DURING FEOL PROCESSING

(75) Inventors: Deleep R. Nair, Wappingers Falls, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 11/970,579

(22) Filed: Jan. 8, 2008

(65) Prior Publication Data

US 2009/0174008 A1 Jul. 9, 2009

(51) Int. Cl.
*H01L 21/8283* (2006.01)
(52) U.S. Cl. .................. 438/142; 438/276
(58) Field of Classification Search .......... 257/369; 438/142
See application file for complete search history.

(56) References Cited

U.S. PATENT DOCUMENTS

| | | | |
|---|---|---|---|
| 5,366,908 A | 11/1994 | Pelella | |
| 5,672,527 A | 9/1997 | Lee | |
| 5,705,411 A | 1/1998 | Yamanobe et al. | |
| 6,107,131 A | 8/2000 | Huang | |
| 6,255,699 B1 * | 7/2001 | Bracchitta et al. | 257/369 |
| 6,417,544 B1 | 7/2002 | Jun et al. | |
| 6,436,754 B1 | 8/2002 | Lee | |
| 6,621,125 B1 * | 9/2003 | Wang | 257/355 |
| 7,595,243 B1 * | 9/2009 | Bulucea et al. | 438/276 |
| 2005/0098831 A1 * | 5/2005 | Lee et al. | 257/357 |
| 2008/0308837 A1 * | 12/2008 | Gauthier et al. | 257/107 |

OTHER PUBLICATIONS

Watanabe et al, Dielectric Breakdown of Gate Insulator Due to Reactive Ion Etching, Solid State Technology, Apr. 1984, pp. 263-266.

\* cited by examiner

*Primary Examiner*—Thanh V Pham
*Assistant Examiner*—Tony Tran
(74) *Attorney, Agent, or Firm*—Yuanmin Cai; Howard M. Cohn

(57) ABSTRACT

Protecting a FET from plasma damage during FEOL processing by forming a FET-like structure in conjunction with and adjacent to an FET, in a same well as the FET, but having a body doped opposite to the well polarity. The FET-like structure is formed with thinner oxide than the gate oxide of the FET, has a gate structure (poly) connected with the gate of the FET, and may be shorted out by the first metal layer (M1).

3 Claims, 7 Drawing Sheets an NFET (204)

a CAP (206)

The PFET at 204

CAP before M1

CAP after M1

US 7,863,112 B2

METHOD AND STRUCTURE TO PROTECT FETS FROM PLASMA DAMAGE DURING FEOL PROCESSING

FIELD OF THE INVENTION

The invention relates to the manufacture of semiconductor devices and, more particularly, to field effect transistors (FETs) and, more particularly, to protecting FETs from plasma process induced damage (PPID) during fabrication.

BACKGROUND OF THE INVENTION

Plasma process induced damage (PPID) can be caused during front-end of the line (FEOL) or back-end of the line (BEOL) steps of the manufacturing process. This damage is caused by the accumulation of charges collected by floating conductors which act like antennas during a plasma processes. In response to this, manufacturers normally limit the size of large plates of metal or polysilicon connected to gate of a transistor by what is called "antenna rules". The PPID problem is severe for thick oxide FETs, as thin oxide FETs have their gate oxide thickness in tunneling injection regime which allows the accumulated charge to tunnel from gate to the substrate. For the thick oxide devices, as the gate oxide thickness is large, there is not much leakage current through tunneling. This enables buildup of the charge at the gate electrode, raising its potential and finally breaking down the oxide or dielectric stack. In some cases, it could be a "hard" breakdown which render the device useless, while some other times it can create latent defects in the gate oxide stack which limits the lifetime of the device. The protection against this is done by limiting the antenna sizes and by requiring protection diodes. But the problem with protection diodes is that they can be connected only at or after laying the first metal level (M1). Lately, industry is employing more and more plasma rich processes in FEOL which cannot be protected by a gate tie-down diode after M1 (first metal). What is needed is a technique for protecting against PPID before M1.

The antenna effect, more formally plasma induced gate oxide damage, is an effect that can potentially cause yield and reliability problems during the manufacture of MOS integrated circuits. Fabs normally supply antenna rules, which are rules that must be obeyed to avoid this problem. A violation of such rules is called an antenna violation. The word antenna is somewhat of a misnomer in this context—the problem is really the collection of charge, not the normal meaning of antenna, which is a device for converting electromagnetic fields to/from electrical currents. Occasionally the phrase antenna effect is used this context, but this is less common since there are many effects and the phrase does not make clear which is meant.

The Field Effect Transistor

The transistor is a solid state semiconductor device which can be used for amplification, switching, voltage stabilization, signal modulation and many other functions. Generally, a transistor has four terminals, and a voltage applied to a specific one of the terminals controls current flowing between the other two terminals.

The terminals of a field effect transistor (FET) are commonly named source, gate, drain and substrate. In the FET a small amount of voltage is applied to the gate (G) in order to control current flowing between the source (S) and drain (D). In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIGS. 1A and 1B illustrate an exemplary, conventional field effect transistor (FET) 100. FIG. 1A is a plan view, and FIG. 1B is a cross-sectional view taken on a line 1B-1B through FIG. 1A.

The FET 100 is formed upon a semiconductor substrate 102, and more particularly within a cell well (CW) portion of the substrate 102. The cell well (CW) is a region of the substrate 102 which has been doped, for example, to be an "n-well" within a "p-type" substrate.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, Ge, III-V compounds like GaAs, SiGe, or an SOI wafer) or one or more die on a wafer, and any epitaxial layers or other type semiconductor layers formed there over or associated therewith.

While particular n- and p-type doping are described herein according to NMOS technology, it is to be appreciated that one or more aspects of the present invention are equally applicable to forming a PMOS (generally, simply by reversing the n- and p-type doping).

As best viewed in FIG. 1B, the FET 100 comprises a p-type substrate, and two spaced-apart n-type diffusion areas—one of which will serve as the "source", the other of which will serve as the "drain" of the transistor. The space between the two diffusion areas is called the "channel". The channel is where current flows, between the source (S) and the drain (D). A schematic symbol for an n-channel MOSFET appears to the left of FIG. 1B.

A thin dielectric layer is disposed over the substrate in the neighborhood of the channel, and a "gate" structure (G) is disposed over the dielectric layer atop the channel. (The dielectric under the gate is also commonly referred to as "gate oxide" or "gate dielectric".) Electrical connections (not shown) may be made to the source (S), the drain (D), and the gate (G). The substrate may be grounded (connected to electrical "ground").

Generally, when there is no voltage applied to the gate, there is no electrical conduction (connection) between the source and the drain. As voltage (of the correct polarity, plus or minus) is applied to the gate, there is a "field effect" in the channel between the source and the drain, and current can flow between the source and the drain. This current flowing in the channel can be controlled by the voltage applied to the gate. In this manner, a small signal (gate voltage) can control a relatively large signal (current flow between the source and the drain).

An integrated circuit (IC) device may comprise many millions of FETs on a single semiconductor "chip" (or "die"), measuring only a few centimeters on each side. Several chips may be formed simultaneously, on a single "wafer", using conventional semiconductor fabrication processes including deposition, doping, photolithography, and etching. As best viewed in FIG. 1A, a trench, labeled "STI" surrounds a single FET 100. "STI" is short for silicon (or shallow) trench isolation, and generally involves forming (such as by etching into the surface of the substrate) a trench around the FET, and filling (such as by deposition) the trench with an insulating material such as silicon dioxide (commonly referred to simply as "oxide"). There can be more than one FET isolated in a STI area. But all of the FETs in a given STI area should be either NFET or PFET (of the same polarity), rather than mixed (both, having opposite polarities).

Although only one STI trench (and a corresponding one FET) is shown in FIG. 1A, it should be understood that the trench may be formed by several intersecting, parallel trenches (like a tic-tac-toe board), as indicated by the dashed lines. The STI insulates (electrically isolates) the enclosed FET from other, neighboring FETs. The area within the trench is referred to as the active silicon region, and may be referred to as "AA". In modern day IC technology, STI is considered to be indispensable. STI is omitted from the view of FIG. 1B, for illustrative clarity.

Normally, the depth of the STI trench will be same across the wafer. But the width of the trench can be different across the wafer. The width of the trench (in the X or Y direction) can narrower than its depth, but it generally cannot be too narrow which is usually a process limitation for every technology node. A plurality of STI trenches (and corresponding plurality of FETs) can be located in the same (a common) cell well which usually extends lower than and underneath the STI trench.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

Anisotropic literally, one directional. An example of an anisotropic process is sunbathing. Only surfaces of the body exposed to the sun become tanned. (see "isotropic").

Ashing Ashing refers to removal (by volatilization) of organic materials (e.g. photoresist) from the wafer surface using strongly oxidizing ambient; e.g. oxygen plasma ashing.

BEOL short for Back End of Line. BEOL operations are performed on the semiconductor wafer in the course of device manufacturing following first metallization. See FEOL.

Capacitor A capacitor is a two-terminal device (electrical or electronic component that can store energy in the electric field between a pair of conductors (called "plates"). The process of storing energy in the capacitor is known as "charging", and involves electric charges of equal magnitude, but opposite polarity, building up on each plate.

Cell Well (CW) the cell well is an area in the silicon substrate that is prepared for functioning as a transistor or memory cell device by doping with an electron acceptor material such as boron or indium (p, electron acceptors or holes) or with an electron donor material such as phosphorous or arsenic (n, electron donors). The depth of a cell well is defined by the depth of the dopant distribution. Usually, the cell well is a big well area for many transistors. Usually, many NFETs will be disposed in one p-well and many PFETs will be disposed in one n-well.

CMOS short for complementary metal oxide semiconductor. CMOS consists of n-channel and p-channel MOS transistors. Due to very low power consumption and dissipation as well minimization of the current in "off" state CMOS is a very effective device configuration for implementation of digital functions. CMOS is a key device in state-of-the-art silicon microelectronics. CMOS Inverter: A pair of two complementary transistors (a p-channel and an n-channel) with the source of the n-channel transistor connected to the drain of the p-channel transistor, and the gates connected to each other. The output (drain of the p-channel transistor) is high whenever the input (gate) is low and the other way round. The CMOS inverter is the basic building block of CMOS digital circuits. NMOS: n-channel CMOS. PMOS: p-channel CMOS.

CMP short for chemical-mechanical polishing. CMP is a process, using both chemicals and abrasives, comparable to lapping (analogous to sanding), for removing material from a built up structure. For example, after depositing and etching a number of elements, the top surface of the resulting structure may very uneven, needing to be smoothed (or leveled) out, prior to performing a subsequent process step. Generally, CMP will level out the high spots, leaving a relatively smooth planar surface.

CVD short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polycrystalline, amorphous, and epitaxial. These materials include: silicon, oxide, nitride and metals, such as are commonly used in semiconductor fabrication.

deposition Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate.

Diode A diode is a two-terminal device (electrical or electronic component) that only conducts electricity in one direction; in the other direction it behaves like an open switch. The term diode is typically taken to refer to a semiconductor device, although alternative implementations such as vacuum tubes are available.

Dopant element introduced into semiconductor to establish either p-type (acceptors) or n-type (donors) conductivity, common dopants in silicon: p-type, boron, B, Indium, In; n-type phosphorous, P, arsenic, As antimony, Sb. Dopants are of two types—"donors" and "acceptors". N type implants are donors and P type are acceptors.

doping doping is the process of introducing impurities (dopants) into the semiconductor substrate, or elements formed on the semiconductor substrate, and is often performed with a mask (or previously-formed elements in place) so that only certain areas of the substrate will be doped. For example, doping is used to form the source and drain regions of an FET. Usually in doping, a dopant, a dosage and an energy level are specified. For example, to form p-type regions, Boron can be implanted as a dose of between about $1E15/cm^2$ and about $5E15/cm^2$ at an energy level of between about 15 keV and about 150 keV to achieve a desired doping profile. An ion implanter is typically employed for the actual implantation. An inert carrier gas such as nitrogen is usually used to bring in the impurity source.

Epitaxy One of the methods that is applied in the semiconductor technology for the extension of the crystalline nature of the silicon substrate is to grow a layer of epitaxy over the surface of the silicon substrate. The term epitaxy (Greek; epi "above" and taxis "in ordered manner") describes an ordered crystalline growth on a monocrystalline substrate. Epitaxial films may be grown from gaseous or liquid precursors. Because the substrate acts as a seed crystal, the deposited film takes on a lattice structure and orientation identical to those of the substrate. This is different from other thin-film deposition methods which deposit polycrystalline or amorphous films, even on single-crystal substrates. If a film is deposited on a substrate of the same composition, the process is called homoepitaxy; otherwise it is called heteroepitaxy.

Etching etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch.

Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically.

Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

FEOL short for Front End of Line. FEOL operations are performed on the semiconductor wafer in the course of device manufacturing up to first metallization. See BEOL.

FET short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (G). Corresponding voltages applied to these terminals may be referred to as Vs, Vd, Vg, respectively. Substrate voltage may also play a role in FET operation.

IC short for integrated circuit. In electronics, an IC (also referred to as microcircuit, microchip, silicon chip, or chip) is a miniaturized electronic circuit consisting mainly of semiconductor devices, as well as passive components, that has been manufactured in or on the surface of a thin substrate of semiconductor material. Among the most advanced integrated circuits are the microprocessors or "cores", which control everything from computers to cellular phones to digital microwave ovens. Digital memory chips and ASICs (application specific ICs) are examples of other families of integrated circuits that are important to the modern information society. While cost of designing and developing a complex integrated circuit is quite high, when spread across typically millions of production units the individual IC cost is minimized. The performance of ICs is high because the small size allows short traces which in turn allows low power logic (such as CMOS) to be used at fast switching speeds.

ILD short for inter-level (or inter-layer) dielectric. Generally, ILD is a relatively thick layer of oxide deposited on completed underlying structures (such as FETs), which will support a layer(s) of metal lines interconnecting the various underlying structures. Holes may be etched through the ILD and filled with metal to make contact with elements (such as source, drain, gate) of the underlying structures.

isotropic literally, identical in all directions. An example of an isotropic process is dissolving a tablet in water. All exposed surfaces of the tablet are uniformly acted upon. (see "anisotropic")

lithography In lithography (or "photolithography"), a radiation sensitive "resist" is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

mask The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask".

metallization Metallization refers to formation of metal contacts and interconnects in the manufacturing of semiconductor devices. This generally occurs after the devices are completely formed, and ready to be connected with one another. A first level or layer of metallization is usually referred to as "M1".

MOS short for metal oxide semiconductor.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

NFET short for Negative Channel (or n-polarity) Field Effect Transistor.

nitride commonly used to refer to silicon nitride (chemical formula $Si_3N_4$). A dielectric material commonly used in integrated circuit manufacturing. Forms an excellent mask (barrier) against oxidation of silicon (Si). Nitride is commonly used as a hard mask (HM).

n-type semiconductor in which concentration of electrons is higher than the concentration of "holes". See p-type.

oxide commonly used to refer to silicon dioxide ($SiO2$). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD. Oxide may also be used to fill STI trenches, form spacer structures, and as an inter-level dielectric, for example.

PFET short for Positive Channel (or p-polarity) Field Effect Transistor.

plasma etching Plasma etching refers to dry etching in which semiconductor wafer is immersed in plasma containing etching species; chemical etching reaction is taking place at the same rate in any direction, i.e. etching is isotropic; can be very selective; used in those applications in which directionality (anisotropy) of etching in not required, e.g. in resist stripping.

poly short for polycrystalline silicon (Si). Heavily doped poly Si is commonly used as a gate contact in silicon MOS and CMOS devices.

p-type semiconductor in which concentration of "holes" is higher than the concentration of electrons. See n-type. Examples of p-type silicon include silicon doped (enhanced) with boron (B), Indium (In) and the like.

resist short for photoresist. also abbreviated "PR". Photoresist is often used as a masking material in photolithographic processes to reproduce either a positive or a negative image on a structure, prior to etching (removal of material which is not masked). PR is usually washed off after having served its purpose as a masking material.

resistor A resistor is a two-terminal device (electrical or electronic component) that resists an electric current by producing a voltage drop between its terminals in accordance with Ohm's law: R=V/I, wherein the electrical resistance (R) is equal to the voltage drop (V) across the resistor divided by the current (I) through the resistor. Resistors are used as part of electrical networks and electronic circuits.

RIE short for Reactive Ion Etching. RIE is a variation of plasma etching in which during etching, the semiconductor wafer is placed on an RF powered electrode. The plasma is generated under low pressure (vacuum) by an electromagnetic field. It uses chemically reactive plasma to remove material deposited on wafers. High-energy ions from the plasma attack the wafer surface and react with it. The wafer takes on potential which accelerates etching species extracted from plasma toward the etched surface. A chemical etching reaction is preferentially taking place in the direction normal to the surface—in other words, etching is more anisotropic than in plasma etching but is less selective. RIE typically leaves the etched surface damaged. RIE is the most common etching mode in semiconductor manufacturing.

self-aligned In fabrication of MOSFETs on integrated circuits, a self-aligned gate is an arrangement where the edges of the source and drain doping regions next to the gate are defined by the same mask that defines the edges of the gate next to the source and drain regions. An overlap between the source, drain and gate regions would be difficult to achieve without the self aligned feature (due to the inherent misalignment between different masking layers). "Self-aligned" may also refer to any process step where a previously-formed structure acts as a mask for a subsequent process step, such as deposition or etching.

Si Silicon, a semiconductor.

SOI short for silicon-on-insulator. Silicon on insulator (SOI) technology refers to the use of a layered silicon-insulator-silicon substrate in place of a conventional silicon substrate in semiconductor manufacturing, especially microelectronics. SOI-based devices differ from conventional silicon-built devices in that the silicon junction is above an electrical insulator, typically silicon dioxide or (less commonly) sapphire.

spacer a spacer, as the name implies, is a material (such as a layer of oxide) disposed on an element (such as a poly gate electrode). For example, sidewall spacers disposed on opposite sides of a gate electrode structure cause subsequent implants to occur further away from the gate than otherwise (without the spacers in place), thereby controlling (increasing) the length of a channel under the gate electrode structure.

STI short for shallow trench isolation. Generally, a trench etched into the substrate and filled with an insulating material such as oxide, to isolate one region of the substrate from an adjacent region of the substrate.

substrate typically a wafer, of monocrystalline silicon. A substrate is often covered by an oxide layer (sometimes referred to as a "pad oxide layer"). Pad oxide is usually relatively thin, e.g., in the range of about 50 to about 500 Angstroms (5-50 nm), and can be formed, for example, by thermal oxidation of the substrate. Pad oxide may also be prepared by other methods. For example, silicon dioxide or reactive precursors like silane could be deposited by chemical vapor deposition (CVD). A nitride layer (sometimes referred to as a "pad nitride layer") may be formed to protect the pad oxide and the underlying substrate during various processing steps. It usually has a thickness in the range of about 100 Angstroms to about 6000 Angstroms (10-600 nm), such as in the range of about 1500 Angstroms to about 3000 Angstroms (150-300 nm). Conventional means can be used to apply the pad nitride, such as chemical vapor deposition (CVD).

Transistor A transistor is a semiconductor device, commonly used as an amplifier or an electrically controlled switch. The transistor is the fundamental building block of the circuitry in computers, cellular phones, and all other modern electronic devices. Because of its fast response and accuracy, the transistor is used in a wide variety of digital and analog functions, including amplification, switching, voltage regulation, signal modulation, and oscillators. Transistors may be packaged individually or as part of an integrated circuit, some with over a billion transistors in a very small area. See FET.

Units of Length Various units of length may be used herein, as follows:
  meter (m) A meter is the SI unit of length, slightly longer than a yard.
    1 meter=~39 inches. 1 kilometer (km)=1000 meters=~0.6 miles.
    1,000,000 microns=1 meter. 1,000 millimeters (mm)=1 meter.
    100 centimeters (cm)=1 meter.
  micron (μm) one millionth of a meter (0.000001 meter); also referred to as a micrometer.
  mil 1/1000 or 0.001 of an inch; 1 mil=25.4 microns.
  nanometer (nm) one billionth of a meter (0.000000001 meter).
  Angstrom (?) one tenth of a billionth of a meter. 10 ?=1 nm.

V short for voltage. Different voltages may be applied to different parts of a transistor or memory cell to control its operation, such as:
Vb short for bulk (or substrate) voltage
Vd short for drain voltage
Vg short for gate voltage
Vs short for source voltage
Vt short for threshold voltage wafer In microelectronics, a wafer is a thin slice of semiconducting material, such as a silicon crystal, upon which microcircuits are constructed. There are multiple orientation planes in the silicon crystal that can be used. The planes are defined by the "Miller Indices" methodology. Common orientations classified by the "Miller indices" are (100), (011), (110), and (111).

SUMMARY OF THE INVENTION

It is a general object of the invention to provide an improved technique for fabricating FETs.

According to the invention, generally, a FET-like device ("CAP") is fabricated alongside of a conventional FET, and they are connected with one another by a poly line (which forms the gate electrode of the FET). The doping condition of the FET may be N-doped, and the doping condition of the CAP may be P-doped. The CAP should have a thinner gate oxide than the FET, so that it will conduct plasma induced charge away from the FET, thereby protecting the FET during FEOL processing. At M1, the S/D diffusions and "gate" of the CAP are tied down (connected together) so that the CAP simply acts as a reverse-biased diode connected in parallel with the FET, and does not adversely affect the performance of the FET during normal operation. The FET can be N- or P-doped and the CAP would be P- or N-doped, respectively. The doping condition (below gate) of FET and CAP is of opposite polarity so that they can sit in the same well.

According to the invention generally, a method and structure are provided for protection of FETs at FEOL. Previous methods were diode like structures which needs at least one metal level for wiring, hence BEOL. The mechanism of previous methods generally was reverse or forward biased diode breakdown and/or leakage. In the present invention, the protection mechanism is carriers tunneling through a thinner gate oxide/insulator device which can be employed before M1 wiring is done.

According to an embodiment of the invention, a method of protecting an FET from plasma damage during FEOL processing comprises: forming a FET-like structure in conjunction with and adjacent to an FET, in a same well as the FET, but having a body doped opposite to the well polarity; when forming gate oxide for the FET, forming oxide on the FET-like structure which is thinner than the gate oxide; and depositing and etching polysilicon having a first portion which will serve as a gate electrode for the FET, and having a second portion which will serve as a gate electrode for the FET-like structure; wherein the first and second portions are connected by a third portion of the polysilicon. Source and drain implants are performed for the FET. The FET-like structure may be shorted out by the first metal layer (M1).

According to an embodiment of the invention, a FET-like structure, formed in conjunction with an FET, for protecting the FET from plasma damage during FEOL processing comprises: a well having a polarity, a first active area defined in the well for forming an FET; a second active area defined in the well, adjacent the first active area, for forming the FET-like structure; the second active area having a body of opposite polarity from the well; a first oxide layer in the first active area comprising gate oxide; a second oxide layer in the second active area which is thinner than the first oxide layer; and polysilicon having a first portion which will serve as a gate electrode for a FET formed in the FET region, and having a second portion which will serve as a gate electrode for a FET-like structure; wherein the first and second portions are connected by a third portion of the polysilicon.

According to an embodiment of the invention, a method of forming a FET comprises: providing a substrate; forming a cell well having a first polarity (N) in the substrate; designating a FET region (204) and a CAP region (206) adjacent the FET region; performing a Vt implant into the FET region so that the FET region is doped with the first polarity (n-doped in n-well); performing an acceptor (P type) implant into the CAP region, forming a well of a second polarity (p-doped in n-well), opposite to the first polarity, within the cell well (N); forming a first oxide in the FET region; and forming a second oxide, thinner than the first oxide in the CAP region.

The oxide for the FET may have a thickness greater than 30 Å (angstroms); and the oxide for the FET-like structure in the CAP region may have a thickness less than 30 Å.

Halo and extension implants may be performed in the FET region.

In the case for protecting PFETs, the FET in the FET region may comprise P+ poly over N-Well; and the FET-like structure in the CAP region may comprise P+ poly over a P-Well.

In the case for protecting NFETs, the FET in the FET region may comprise N+ poly over P-Well; and the FET-like structure in the CAP region may comprise N+ poly over a N-Well.

Source, drain and gate terminals of the FET-like structure may be connected with one another, and to the gate of the FET, by first metal (M1).

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Figure 1A:
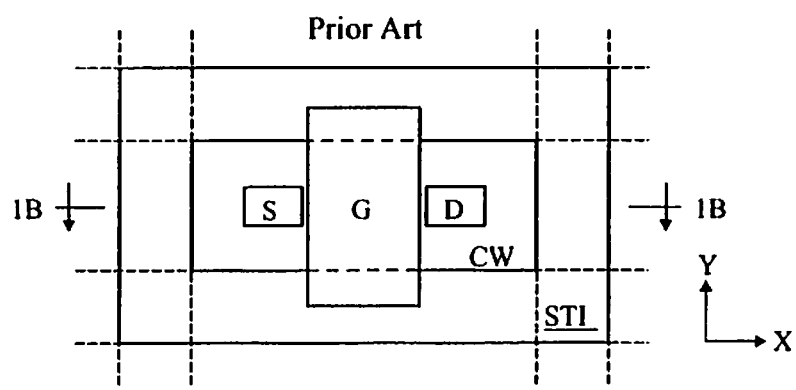

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

Figure 2:
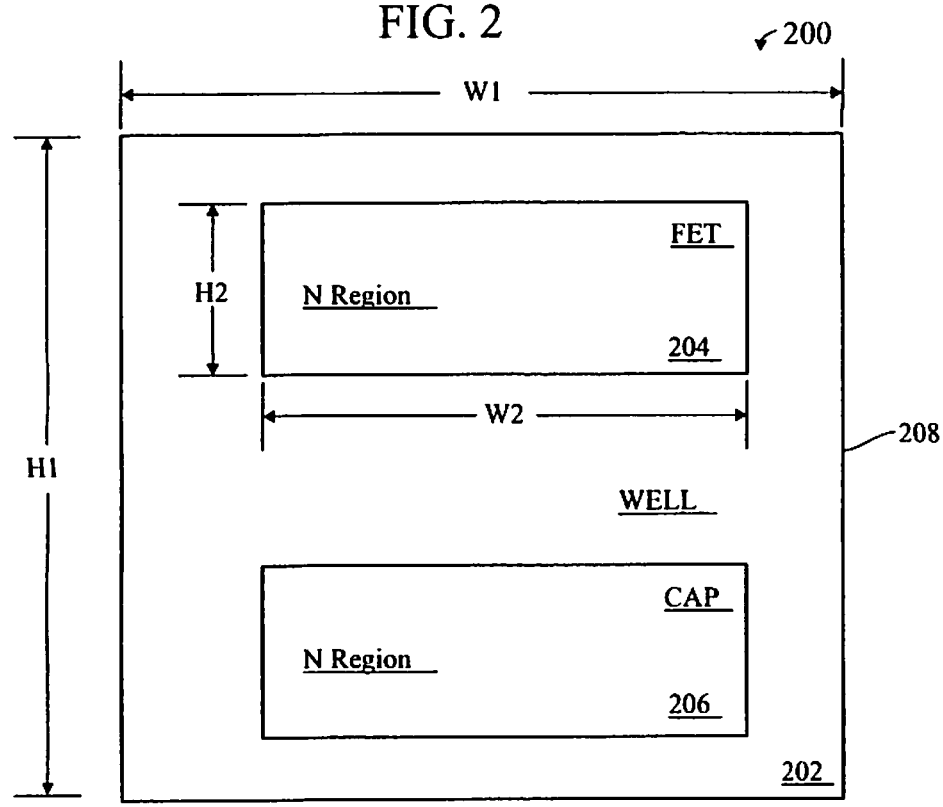

FIG. 1A is a plan view of a field effect transistor (FET), according to the prior art.

Figure 1B:
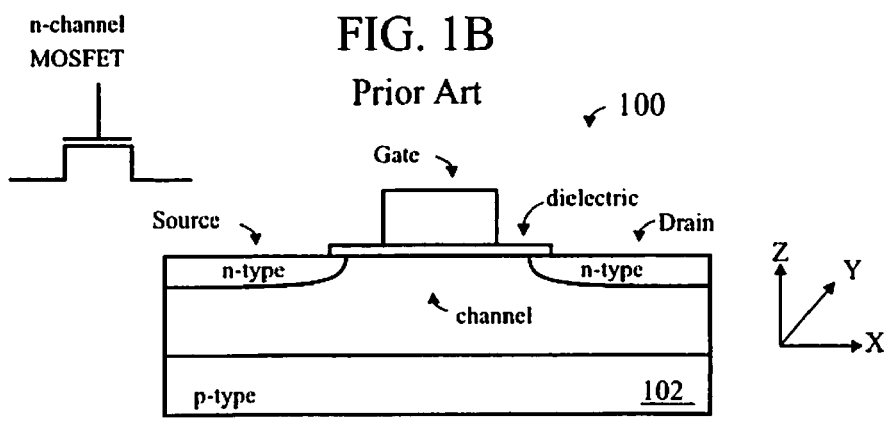

FIG. 1B is a cross-sectional view taken on a line 1B-1B through FIG. 1A.

FIGS. 2-12 are plan views of a portion of a semiconductor substrate being subjected to a sequence of steps in a process for fabricating a substrate with an FET and a capacitor-like structure (CAP) for protecting the FET during FEOL processing, according to an embodiment of the invention.

Figure 9:
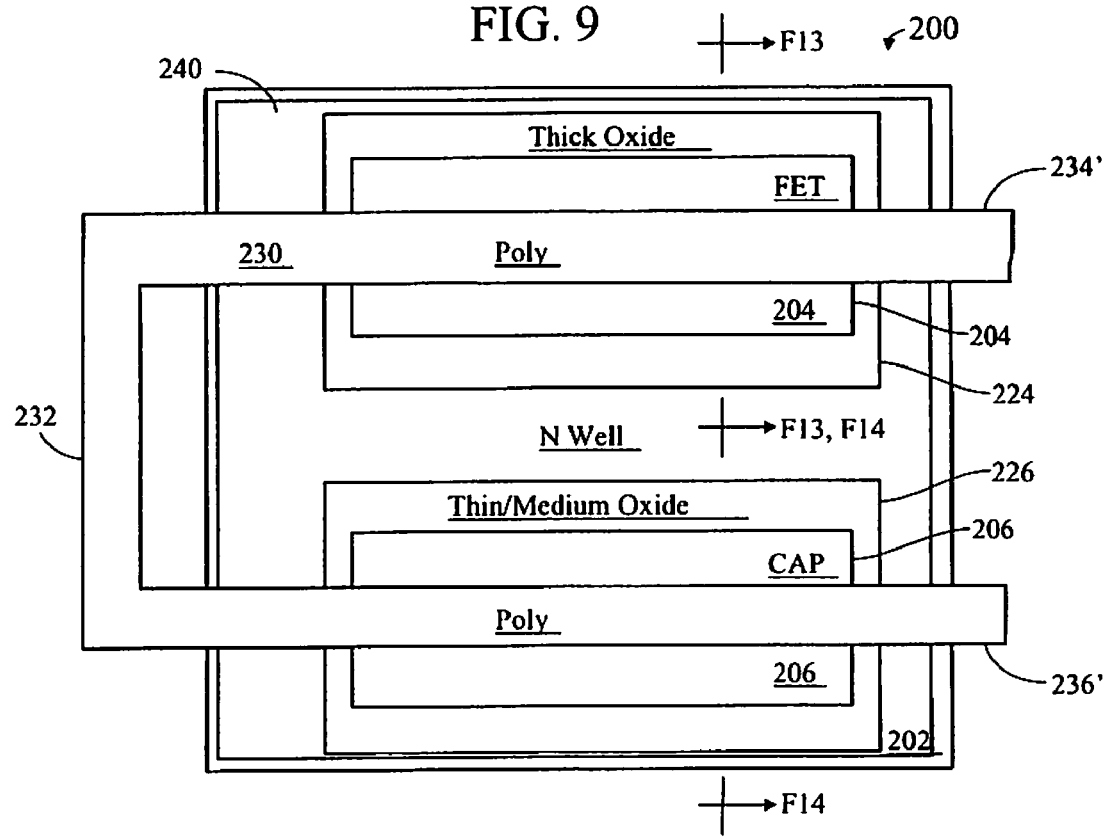
Figure 13:
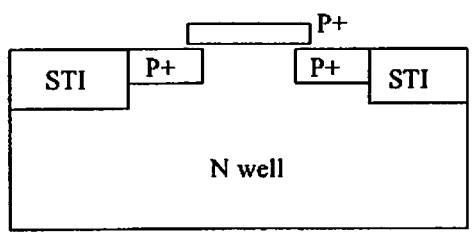

FIG. 13 is a cross-sectional view, taken substantially on a line F13-F13 through FIG. 9, showing the FET.

Figure 14A:
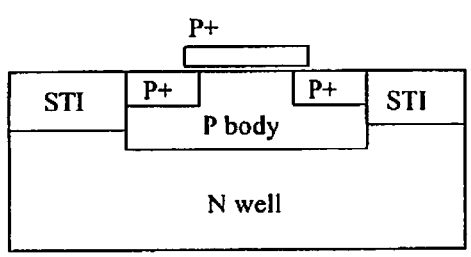

FIG. 14A is a cross-sectional view, taken substantially on a line F14-F14 through FIG. 9, showing the capacitor-like structure (CAP), before M1.

Figure 12:
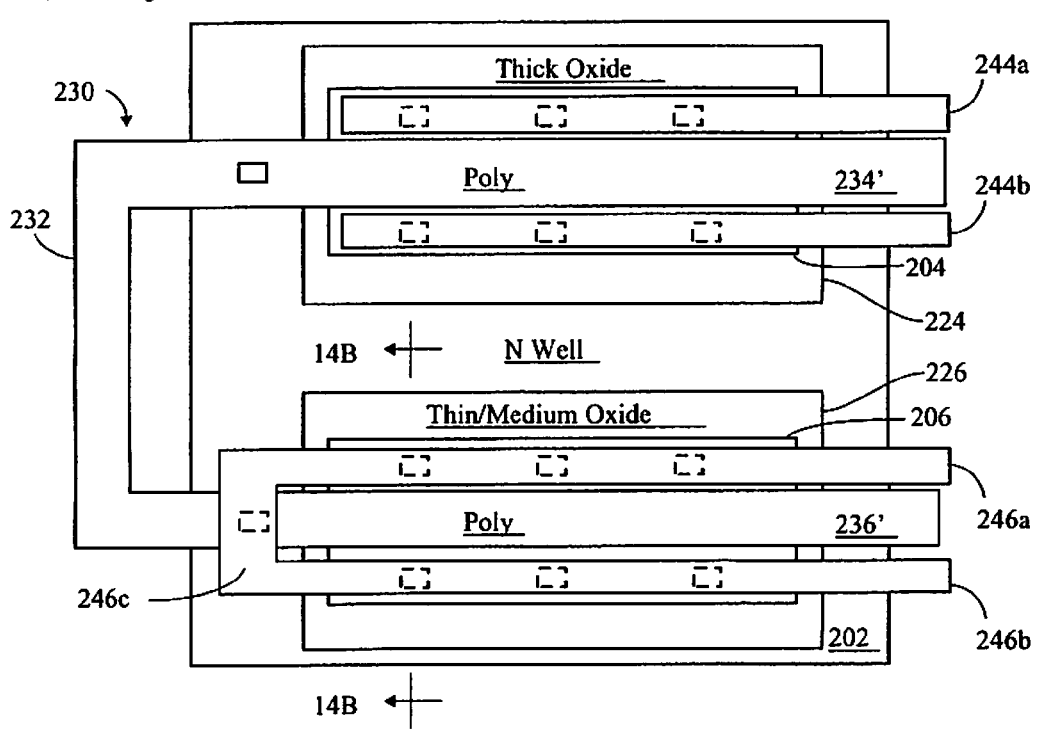
Figure 14B:
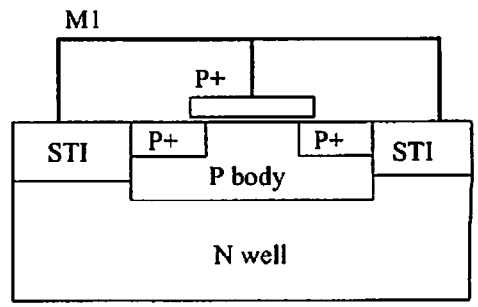

FIG. 14B is a cross-sectional view, taken substantially on a line 14B-14B through FIG. 12, showing the capacitor-like structure (CAP), after M1.

Figure 15:
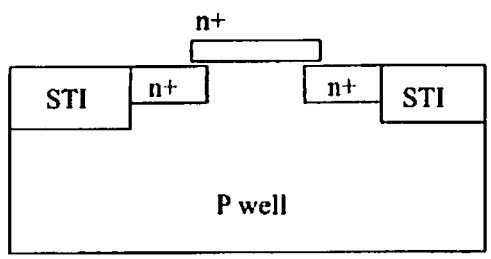
Figure 16:
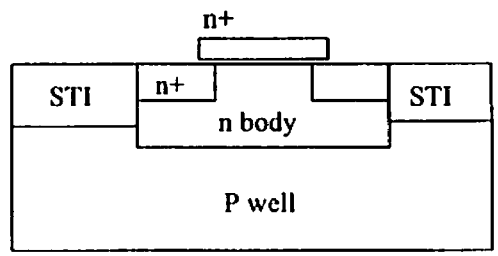

FIGS. 15 and 16 are cross-sectional views, similar to FIGS. 13 and 14A, showing the FET and CAP, with opposite polarity.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H2O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

FETs are exposed to plasma damage from FEOL processing. All steps involving plasma process after gate stack deposition can induce damage. The steps could be gate etch, spacer deposition and etch, stress liner deposition and etch, contact etch etc. In a chip, there are transistors with different gate oxide thickness—thin, medium and thick gate oxide. They are targeted for different applications. Plasma damage may increases with gate oxide thickness.

This is aggravated due to the usage of more plasma processing steps with the introduction of a stress liner to improve logic performance. Gate tie-down at M1 is a commonly-used method to prevent plasma damage from BEOL processing. This kind of protection doesn't help to prevent the damage from FEOL. A decrease in reliability performances can be observed even when the FET is stressed at M1 in terms of thick gate oxide breakdown and NBTI (negative bias temperature instability). In order to circumvent this problem, a protection circuitry is implemented which is operational during the FEOL steps and which does not obstruct the normal FET operation past M1.

Thick oxide devices are often more prone to plasma damage as accumulated charges don't have a path to leak away. In this invention, a device is described which can serve this purpose. This device is essentially a thin/medium oxide capacitor-like structure ("CAP") connected to a gate of thick oxide FET. Before M1, the CAP device acts like a capacitor providing the leakage current to flush away the accumulated charge. After M1, the CAP device becomes a normal protection diode which is reverse biased at normal FET operating conditions.

FIG. 2 (N-well Region and AA) shows a first step in the process of forming a protection device for FEOL damage, wherein two N-regions 204 and 206 formed in a substrate 202. The overall box 208 represents the cell well. The two regions 204 and 206 are active areas (AA) within the cell well, and are adjacent one another. The area outside of the Active Areas 204 and 206 may be STI.

As described in greater detail hereinbelow, a FET will be formed in the N-region 204, which is also referred to as "FET", and another FET will be formed in the N-region 206, which is also referred to as "CAP" (this device may function like a capacitor during FEOL processing, hence the nomenclature "CAP").

Exemplary height and width dimensions for the CAP region 206 may be substantially equal to those of the FET region 204.

Figure 3:
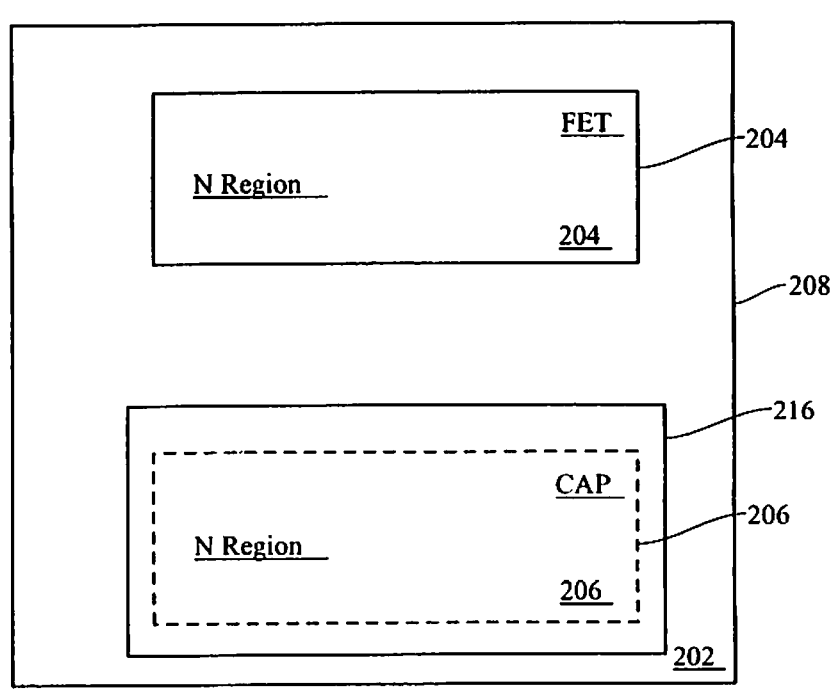

FIG. 3 (PFET Vt implant) shows a next step, wherein the CAP region 206 being blocked (masked, such as with photoresist 216) during performing a PFET Vt implant on the FET region 204.

Figure 4:
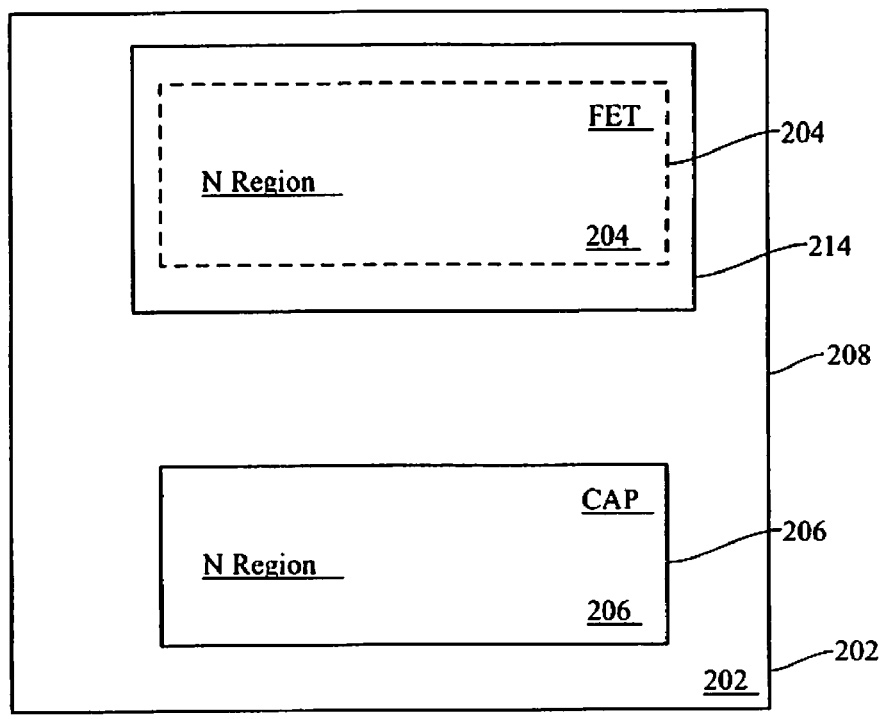

FIG. 4 (Implant Acceptor) shows the FET region 204 being blocked (masked, such as with photoresist 214) during performing an acceptor (P type) implant into the CAP region.

Here, the substrate in the CAP region 206 is p-doped, forming a p-well within the original n-well.

Figure 5:
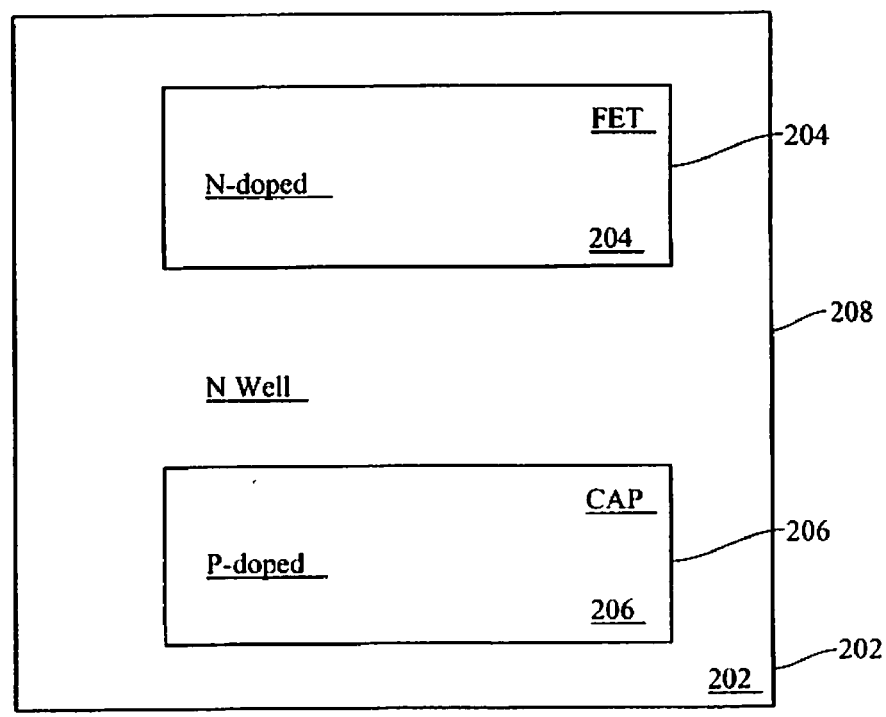

FIG. 5 (Doping Condition) shows a doping condition resulting from the previous two steps (FIGS. 3 and 4). The FET region 204 is N-doped, and the CAP region 206 is P-doped.

A feature of the invention is that the CAP region 206 is doped "opposite" to the FET region 204, they have opposite "polarity". The FET region 204 is N-doped in n-well, and the CAP region 206 is P-doped in n-well.

Figure 6:
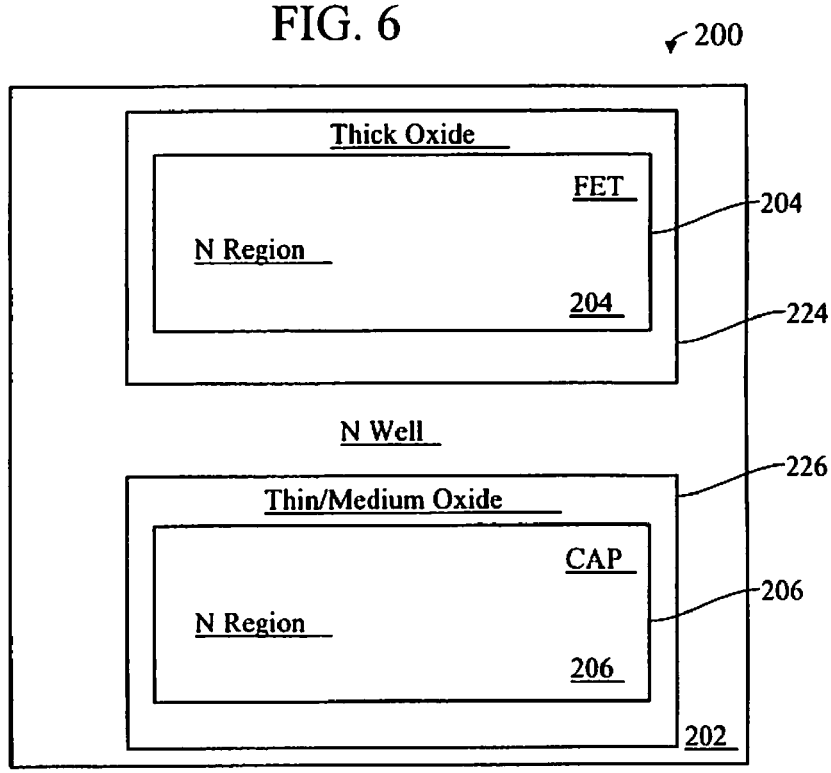

FIG. 6 (Grow Oxide) shows a next step, wherein oxide 224 is formed (grown or deposited) on the FET region 204, and oxide 226 is grown or deposited on the CAP region 206. The oxide for the FET (204) will serve as gate oxide (or gate dielectric, compare FIG. 1B). At the same stage of the process, a thinner oxide is formed for the FET-like device at 206.

The oxide 224 on the FET region 204 may be thick oxide, such as having a thickness greater than 30 Å (angstroms). The oxide 226 on the cap region 206 may be thin oxide, such as having a thickness less than 20 Å, or it may be medium oxide, such as having a thickness between 20 and 30 Å.

Figure 7:
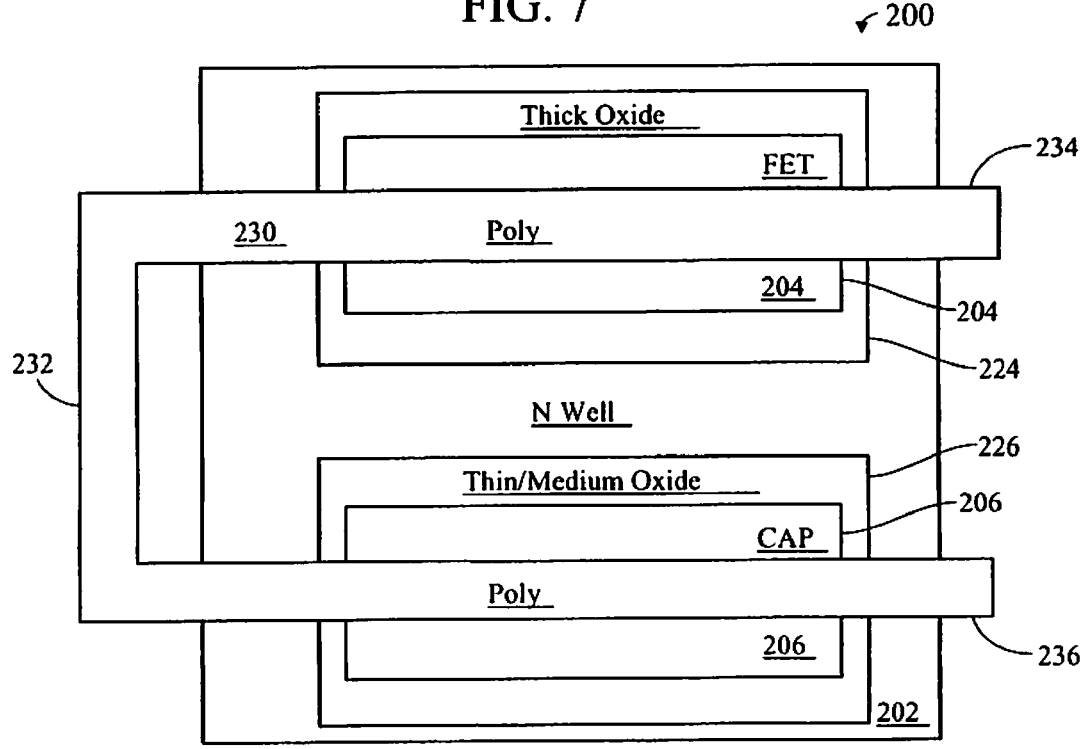

FIG. 7 (Poly deposition and etch) shows a next step, wherein polysilicon (Poly) 230 is deposited and etched.

A portion 234 of the poly 230 extends over the FET region 204 and will serve as the gate electrode for an FET formed in the FET region 204.

A portion 236 of the poly 230 extends over the CAP region 206 and will serve as the gate electrode for a FET-like structure formed in the CAP region 204.

The portion 234 is connected with the portion 236 by a portion 232. The two regions 204 and 206 are now connected, in this FEOL process. The gate of the to-be-formed FET in the FET region 204 is connected with the gate of the to-be-formed FET in the CAP region 206.

Figure 8:
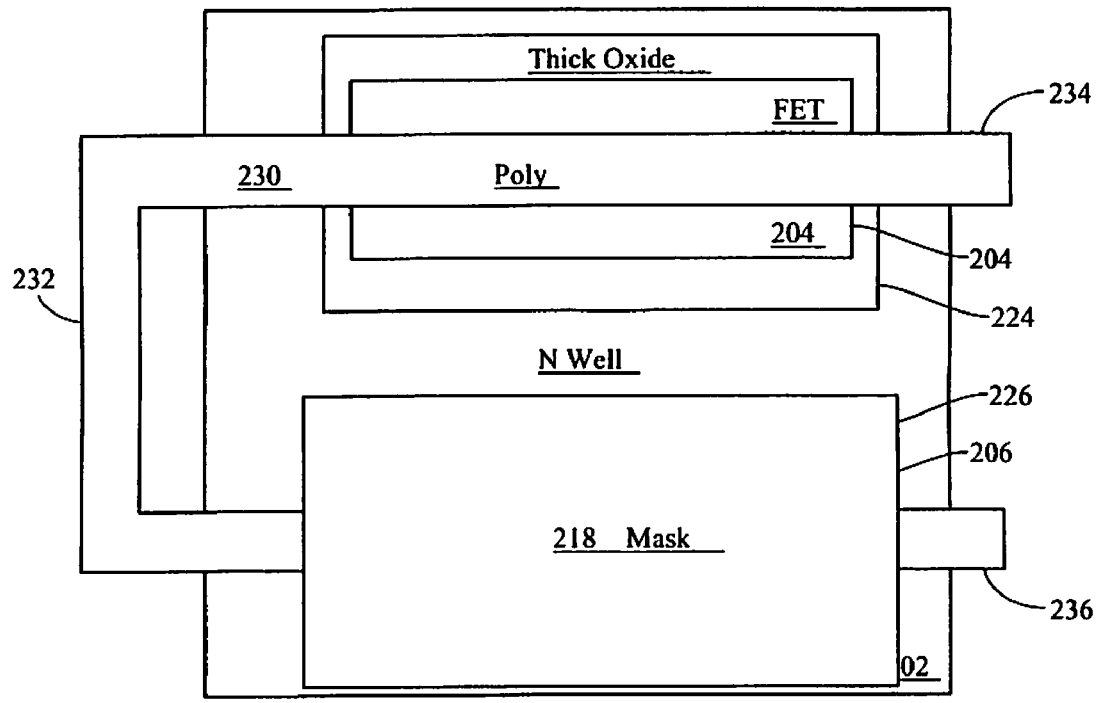

FIG. 8 (halo/ext) shows a next step, wherein the CAP region 206 is masked (such as by photoresist 218), and a halo and extension are formed in the FET region 204. The CAP region 206 shouldn't receive halo as the doping polarity is opposite to that of FET region 204. However, it can receive the extension, as they are of same polarity. Normally halo and extension implants are done at same stages through the same opening. If so, the CAP region 206 should not receive that, but if they are different, it can receive extension.

FIG. 9 (P+S/D implant) shows a next step, wherein a P+ source/drain (S/D) implant is performed. P+ dopants are usually B, BF2, species containing elements of Group III in periodic table which can act as acceptors in silicon lattice. The doping levels are typically in the range $10^{20}$-$10^{22}$ atoms/cm3.

No masking is involved here (in the area being represented in the figures). Therefore, both the CAP 206 and the FET 204 receive this implant.

Generally, only the PFET formed in region 204 and the CAP connected to PFET active area receives this implant as rest of the area (not shown) is STI and NFET areas which shouldn't receive this implant. Even though no mask is showed here, there would be a mask which prevents NFETs and CAPs connected to the NFETs from receiving this implant.

The CAP 206 therefore becomes P+ poly 236' (prime, doped) over P-Well (see FIG. 5).

The FET 204 therefore becomes P+ poly 234' (prime, doped) over N-Well (see FIG. 5).

Figure 10:
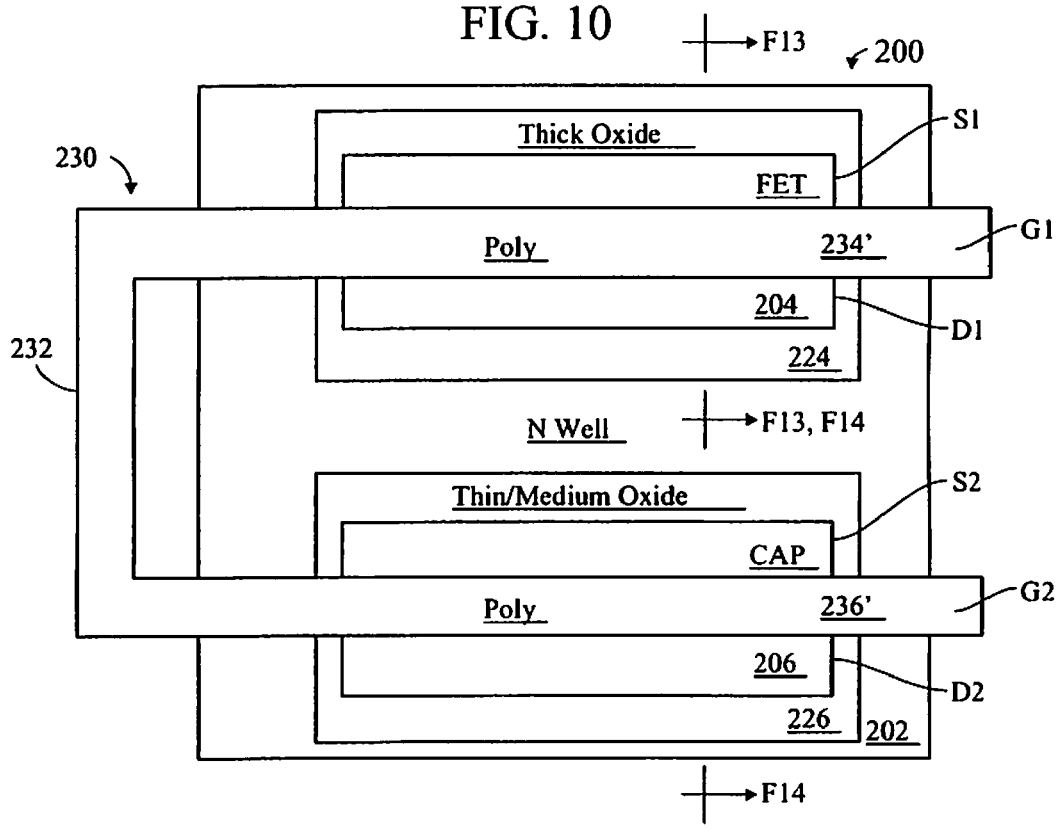

Cross-section lines for FIGS. 13 and 14 are shown in FIGS. 9 and 10.

FIG. 10 shows next steps in the process. A conventional stress liner or CESL (contact etch stop liner), not shown, may be deposited. The same stress liner may be deposited on both FET and CAP. The stress liner is to improve performance of the FET at 204, and is not important for the CAP at 206.

A pre-metal layer (PMD) or inter-layer dielectric (ILD) layer, both of which are conventional (not shown) is formed, which will support metallization (M1).

During this step, because the FET 204 is connected by poly 230 with the CAP 206, charge accumulated on the thick oxide 224 of the FET 204 can leak away through the thin oxide 226 of the CAP 206.

The FET formed at 204 has thicker oxide compared to CAP formed at 206. The CAP may have thin or medium gate oxide. It should be understood that the FET or CAP is not restricted to polySi/Silicon dioxide/silicon type usual structure. It may be gate stack with high k dielectric as gate insulator with poly Silicon or metal as gate electrode.

The FET in FET region 204 is shown having a source (S1), a drain (D1) and a gate (G1).

The FET in CAP region 206 is shown having a source (S2), a drain (D2) and a gate (G2).

Figure 11:
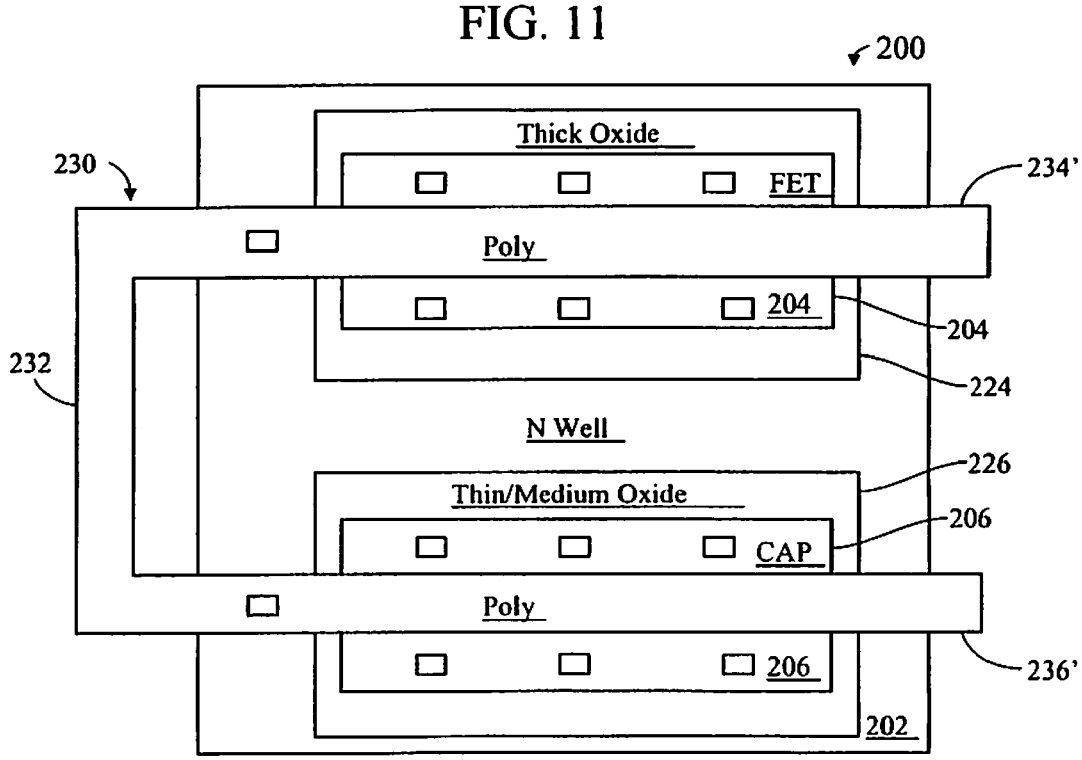

FIG. 11 (CA contact opening) shows next steps, wherein a plurality of openings are made (through the ILD and stress liner, described with respect to FIG. 9) to make contact with the source (S1) and drain (D1) regions of the FET 204, as well as to the "source" (S2) and "drain" (D2) regions of the CAP 206.

FIG. 12 (M1 wiring), shows a next step, wherein first layer metal (M1), is deposited. The M1 (generally referred to as "244") overfills the contact openings, and forms a pattern on the surface of the ILD (or PMD).

For the FET formed in the FET region 204,
a portion 244a of M1 extends across the diffusion above (as illustrated) the portion 234' of the poly, and may form a connection to the source (S1) of the FET.
a portion 244b of M1 extends across the diffusion below (as illustrated) the portion 234' of the poly, and may form a connection to the drain (D1) of the FET.
For the FET-like device formed in the CAP region 206,
a portion 246a of M1 extends across the diffusion above (as illustrated) the portion 236' of the poly, and may form a connection to the source (S2) of the device.
a portion 246b of M1 extends across the diffusion below (as illustrated) the portion 236' of the poly, and may form a connection to the drain (D2) of the device.
a portion 246c connects the portions 246a and 246b, as illustrated, crossing over the poly 236' and also connecting to the poly 236'.
For the CAP 206, at M1, diffusion, body and gate are connected. (See also FIG. 14B)

FIG. 13 shows a resulting FET formed in the FET region 204. The source and drain are p+, and are sitting in an n-well. This is a PFET. STI is shown.

FIG. 14A is a cross-section of CAP device 206, before M1. Before M1, the CAP device acts like a capacitor providing leakage current to flush the accumulated charges from plasma processing. What really matters here is not the capacitance of device, but its ability to conduct.

FIG. 14B is a cross-section of CAP device 206, after M1. Note that the source, drain and gate are all shorted out (connected with one another) by M1. After M1, the CAP device acts like a reverse biased diode under normal FET operations.

The CAP device 206 is used to provide a leakage path for the accumulated charge. That is only used as a device which can provide leakage current and not to provide any capacitance. Connecting CAP gate and diffusion at M1 prevents the thin oxide to breakdown and leak when the FET is measured. The CAP body is a p+/p junction. When the FET is operating (Vg=−2.5V), the p+/n well diode is reverse biased and acts like usual tie-down diode protection. The same principle can be applied to NFETs also which is shown in FIG. 15.

The FET can be N- or P-doped and the CAP (FET-like structure) would be P- or N-doped, respectively. The doping condition (below gate) of FET and CAP is of opposite polarity so that they can sit in the same well. The CAP has a "body" (a small P-well) which is doped opposite to the larger N-well within which it is located. The polarities shown above (FIGS. 13 and 14A/B) are for PFET. The polarities can be reversed, for NFET.

FIG. 15 (compare FIG. 13) shows an NFET device of opposite polarity to the PFET device formed at 204, and FIG. 16 (compare FIG. 14B) shows a CAP device of opposite polarity to the CAP device formed at 206 (CAP shown before M1).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of protecting a FET from plasma damage during FEOL processing comprising:
    forming a FET-like structure in conjunction with and adjacent to an FET, in a same well as the FET, but having a body doped opposite to the well polarity; when forming gate oxide for the FET, forming oxide on the FET-like structure which is thinner than the gate oxide; and
    depositing and etching polysilicon having a first portion which will serve as a gate electrode for the FET, and having a second portion which will serve as a gate electrode for the FET-like structure; wherein the first and second portions are connected by a third portion of the polysilicon;
    performing source and drain implants for the FET;
    depositing a pre-metal layer (PMD);
    forming a plurality of contact openings through the PMD to make contact with source (S1) and drain (D1) regions of the FET in the FET region, as well as to source (S2) and drain (D2) regions of the FET-like structure;
    depositing a first metal layer (M1) overfilling the contact openings; and
    patterning the first metal layer;
    wherein:
    a first portion of M1 forms a connection with the source (S1) of the FET;
    a second portion M1 forms a connection with the drain (D1) of the FET;
    a third portion of M1 forms a connection to the source (S2) of the FET-like structure;
    a fourth portion of M1 forms a connection to the drain (D2) of the FET-like structure; and
    a fifth portion of M1 connects the third and fourth portions, and also connects to the polysilicon, thereby shorting out the FET-like structure.

2. The method of claim 1, wherein:
    the FET in the FET region comprises P+ poly over N-Well; and
    the FET-like structure comprises N+ poly over a N-Well.

3. A method of forming a FET comprising:
    providing a substrate;
    forming a cell well having a first polarity (N-type or N doped) in the substrate;
    designating a FET region (204) and a CAP region (206) adjacent the FET region;
    performing a Vt implant into the FET region so that the FET region is doped with the first polarity (n-doped in n-well);
    performing an acceptor (P type) implant into the CAP region, forming a well of a second polarity (p-doped in n-well), opposite to the first polarity, within the cell well (N-type or N doped);
    forming a first oxide in the FET region;
    forming a second oxide, thinner than the first oxide in the CAP region;
    depositing and etching polysilicon having a first portion which will serve as a gate electrode for a FET formed in the FET region, and having a second portion which will serve as a gate electrode for a FET-like structure formed in the CAP region, wherein the first and second portions are connected by a third portion of the polysilicon;
    performing source and drain implants in the FET region;
    depositing a pre-metal layer (PMD);
    forming a plurality of contact openings through the PMD to make contact with source (S1) and drain (D1) regions of the FET in the FET region, as well as to source (S2) and drain (D2) regions of the FET-like structure in the CAP region;
    depositing a first metal layer (M1) overfilling the contact openings; and
    patterning the first metal layer;
    wherein:
    a first portion of M1 forms a connection with the source (S1) of the FET;
    a second portion M1 forms a connection with the drain (D1) of the FET;
    a third portion of M1 forms a connection to the source (S2) of the FET-like structure;
    a fourth portion of M1 forms a connection to the drain (D2) of the FET-like structure; and
    a fifth portion of M1 connects the third and fourth portions, and also connects to the polysilicon, thereby shorting out the FET-like structure.

* * * * *